(12) United States Patent
Kato et al.

(10) Patent No.: US 6,662,465 B2
(45) Date of Patent: Dec. 16, 2003

(54) VACUUM PROCESSING APPARATUS

(75) Inventors: Shigekazu Kato, Kudamatsu; Kouji Nishihata, Tokuyama; Tsunehiko Tsubone, Hikari; Atsushi Itou, Kudamatsu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/781,295

(22) Filed: Feb. 13, 2001

(65) Prior Publication Data

US 2001/0008051 A1 Jul. 19, 2001

Related U.S. Application Data

(62) Division of application No. 09/461,432, filed on Dec. 16, 1999, now Pat. No. 6,330,755, which is a continuation of application No. 09/177,495, filed on Oct. 23, 1998, now Pat. No. 6,012,235, which is a continuation of application No. 09/061,062, filed on Apr. 16, 1998, now Pat. No. 5,950,330, which is a continuation of application No. 08/882,731, filed on Jun. 26, 1997, now Pat. No. 5,784,799, which is a division of application No. 08/593,870, filed on Jan. 30, 1996, now Pat. No. 5,661,913, which is a continuation of application No. 08/443,039, filed on May 17, 1995, now Pat. No. 5,553,396, which is a division of application No. 08/302,443, filed on Sep. 9, 1994, now Pat. No. 5,457,896, which is a continuation of application No. 08/096,256, filed on Jul. 26, 1993, now Pat. No. 5,349,762, which is a continuation of application No. 07/751,952, filed on Aug. 29, 1991, now abandoned.

(30) Foreign Application Priority Data

Aug. 29, 1990 (JP) .............................. 2-225321

(51) Int. Cl.[7] ................................. F26B 13/30
(52) U.S. Cl. ................. 34/92; 34/60; 34/236; 414/217; 414/222.3; 414/939
(58) Field of Search .................. 34/60, 92, 218, 34/228, 229, 232, 236; 414/217, 222.13, 225, 226, 785, 937, 939, 940

(56) References Cited

U.S. PATENT DOCUMENTS

| 3,652,444 A | 2/1972 | Lester et al. |
| 3,981,791 A | 9/1976 | Rosvold |
| 4,138,306 A | 2/1979 | Niwa .................... 156/345 |

(List continued on next page.)

FOREIGN PATENT DOCUMENTS

| EP | 20246453 | 4/1987 |
| EP | 20381338 | 5/1990 |
| JP | 5729577 | 2/1982 |

(List continued on next page.)

OTHER PUBLICATIONS

R.P.H. Chang, "Multipurpose plasma reactor for materials research and processing", J. Vac. Sci. Technol., vol. 14, No. 1, Jan./Feb. 1977, pp. 278–280.

Semiconductor Equipment Association of Japan, "Terminological Dictionary of Semiconductor Equipment", front, table, p. 183, back, Nov. 20, 1987.

Semiconductor Equipment Association of Japan, "Semiconductor News", vol. 4, pp. 38–43, Apr. 10, 1987 (w/translation).

Japanese Office Action dated Apr. 16, 2002.

*Primary Examiner*—Ira S. Lazarus
*Assistant Examiner*—Kathryn S. O'Malley
(74) *Attorney, Agent, or Firm*—Antonelli, Terry, Stout & Kraus, LLP

(57) ABSTRACT

A vacuum processing apparatus which includes a conveyor structure for transferring a substrate from a substrate storage device held on a substrate storage device mount table. The apparatus further includes a vacuum loader provided with an additional conveyor structure and a vacuum processing chamber for sequentially loading substrate to be processed. The conveyor structures are each provided with a robot.

46 Claims, 1 Drawing Sheet

U.S. PATENT DOCUMENTS

| | | |
|---|---|---|
| 4,226,897 A | 10/1980 | Coleman |
| 4,311,427 A | 1/1982 | Coad et al. |
| 4,313,783 A | 2/1982 | Davies et al. |
| 4,313,815 A | 2/1982 | Graves, Jr. et al. |
| 4,318,767 A | 3/1982 | Hijikata et al. |
| 4,449,885 A | 5/1984 | Hertel et al. |
| 4,457,661 A | 7/1984 | Flint et al. |
| 4,534,314 A | 8/1985 | Ackley |
| 4,563,240 A | 1/1986 | Shibata et al. |
| 4,576,698 A | 3/1986 | Gallagher et al. .......... 204/192 |
| 4,634,331 A | 1/1987 | Hertel |
| 4,643,629 A | 2/1987 | Takahashi et al. ......... 414/331 |
| 4,705,951 A | 11/1987 | Layman et al. |
| 4,715,764 A | 12/1987 | Hutchinson |
| 4,824,309 A | 4/1989 | Kakehi et al. .............. 414/217 |
| 4,836,733 A | 6/1989 | Hertel et al. |
| 4,836,905 A | 6/1989 | Davis et al. |
| 4,851,101 A | 7/1989 | Hutchinson |
| 4,895,107 A | 1/1990 | Yano et al. |
| 4,902,934 A | 2/1990 | Miyamura et al. |
| 4,903,937 A | 2/1990 | Jakubiec et al. |
| 4,909,695 A | 3/1990 | Hurwitt et al. |
| 4,911,597 A | 3/1990 | Maydan et al. |
| 4,915,564 A | 4/1990 | Eror et al. |
| 4,917,556 A | 4/1990 | Stark et al. |
| 4,923,584 A | 5/1990 | Bramhall, Jr. et al. |
| 4,924,890 A | 5/1990 | Giles et al. ................. 134/902 |
| 4,936,329 A | 6/1990 | Michael et al. ............. 134/902 |
| 4,951,601 A | 8/1990 | Maydan et al. ......... 414/217 X |
| 4,969,790 A | 11/1990 | Petz et al. |
| 5,007,981 A | 4/1991 | Kawasaki et al. |
| 5,014,217 A | 5/1991 | Savage ....................... 364/550 |
| 5,292,393 A | 3/1994 | Maydan et al. |
| 5,351,415 A | 10/1994 | Brooks et al. ................. 34/389 |
| 5,436,848 A | 7/1995 | Nishida et al. |
| 5,452,166 A | 9/1995 | Aylwin et al. |
| 5,462,397 A | 10/1995 | Iwabuchi .................... 414/222 |
| 5,504,033 A | 4/1996 | Bajor et al. |
| 5,504,347 A | 4/1996 | Jovanovic et al. |
| 5,509,771 A | 4/1996 | Hiroki ........................ 414/217 |
| 5,556,714 A | 9/1996 | Fukuyama et al. |
| 5,651,858 A | 7/1997 | Lin |
| 5,675,461 A | 10/1997 | Aylwin et al. |
| 5,685,684 A | 11/1997 | Kato et al. .................. 414/217 |
| 5,746,565 A * | 5/1998 | Tepolt ..................... 414/744.5 |

FOREIGN PATENT DOCUMENTS

| | | |
|---|---|---|
| JP | 60246635 | 12/1985 |
| JP | 6244571 | 2/1987 |
| JP | 6250463 | 3/1987 |
| JP | 6289881 | 4/1987 |
| JP | 62207866 | 9/1987 |
| JP | 63153270 | 6/1988 |
| JP | 636582 | 1/1989 |
| JP | 6412037 | 1/1989 |
| JP | 131970 | 2/1989 |
| JP | 131971 | 2/1989 |
| JP | 1135015 | 5/1989 |
| JP | 1-170013 | 6/1989 |
| JP | 1251734 | 10/1989 |
| JP | 1298180 | 12/1989 |
| JP | 1310553 | 12/1989 |
| JP | 261064 | 3/1990 |
| JP | 265252 | 3/1990 |
| JP | 294647 | 4/1990 |
| JP | 2106037 | 4/1990 |
| JP | 430549 | 4/1992 |
| WO | 8707309 | 5/1987 |

* cited by examiner

VACUUM PROCESSING APPARATUS

This application is a Divisional application of application Ser. No. 09/461,432, filed Dec. 16, 1999, now U.S. Pat. No. 6,330,755, which is a Continuation application of application Ser. No. 09/177,495, filed Oct. 23, 1998, now U.S. Pat. No. 6,012,235, which is a Continuation application of application Ser. No. 09/061,062, filed Apr. 16, 1998, now U.S. Pat. No. 5,950,330, which is a Continuation application of application Ser. No. 08/882,731, filed Jun. 26, 1997, now U.S. Pat. No. 5,784,799, which is a Divisional application of application Ser. No. 08/593,870, filed Jan. 30, 1996, now U.S. Pat. No. 5,661,913, which is a Continuing application of application Ser. No. 08/443,039, filed May 17, 1995, now U.S. Pat. No. 5,553,396, which is a Divisional application of application Ser. No. 08/302,443, filed Sep. 9, 1994, now U.S. Pat. No. 5,457,896, which is a Continuing application of application Ser. No. 08/096,256, filed Jul. 26, 1993, now U.S. Pat. No. 5,349,762, which is a Continuing application of application Ser. No. 07/751,952, filed Aug. 29, 1991, now abandoned.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparatus and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988. This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual was used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means for storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
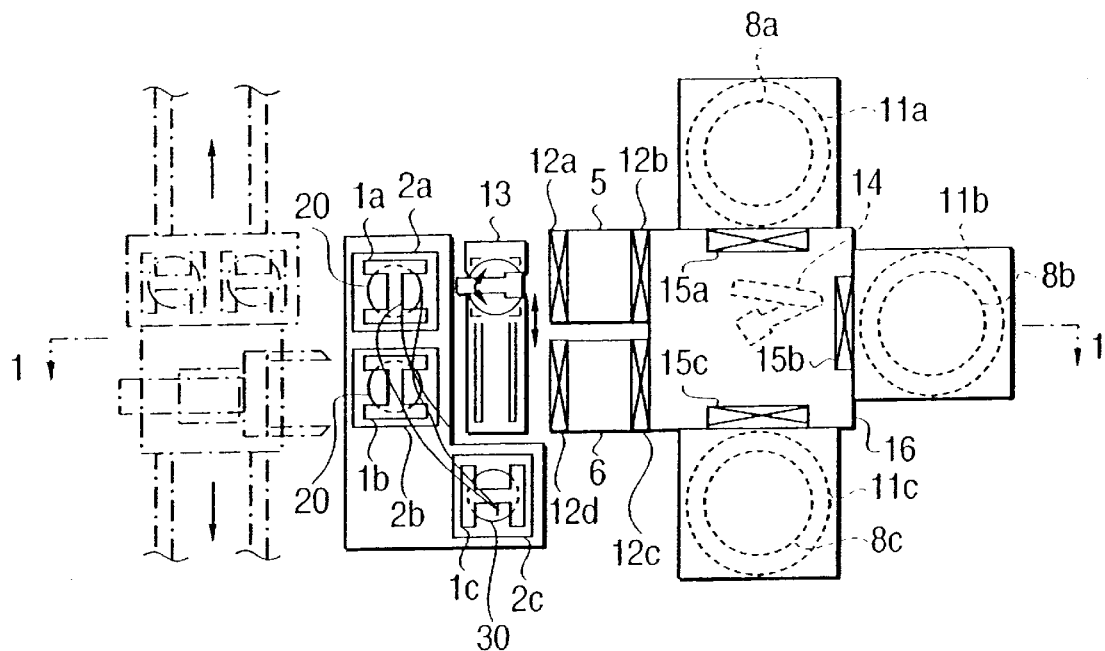
FIG. 1 is a plan view of a dry etching apparatus as an embodiment of a vacuum processing apparatus in accordance with the present invention.
Figure 2:
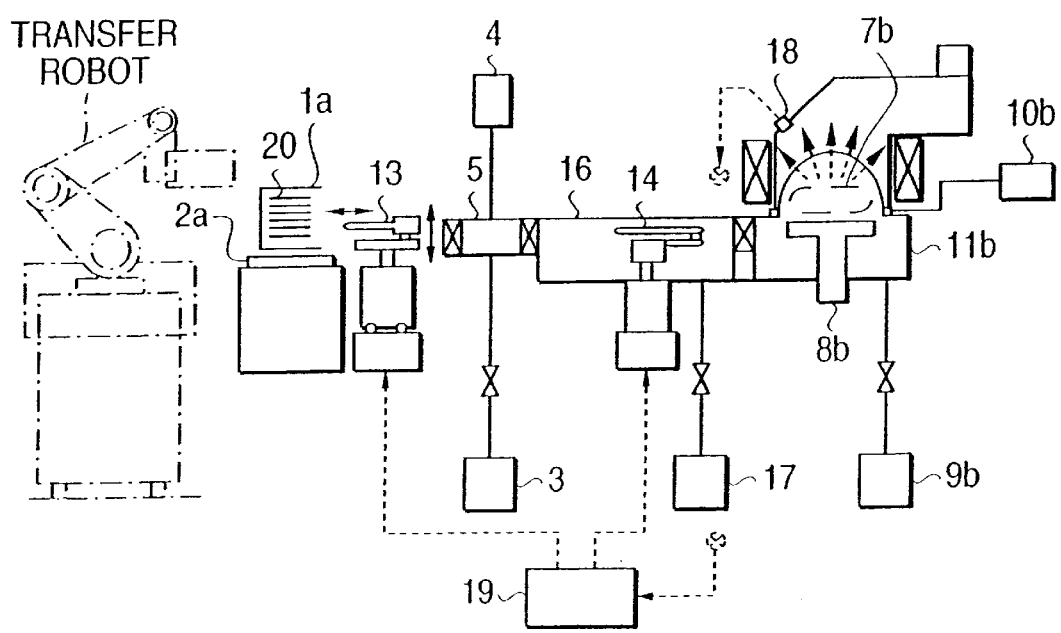
FIG. 2 is a vertical sectional view taken along line 1—1 of FIG. 1.

FIGS. 1 and 2 show a vacuum processing apparatus of the present invention which is, in this case, a dry-etching apparatus for etching wafers, i.e., substrates to be processed by plasma.

Cassette tables 2a to 2c are disposed in an L-shape in this case in positions such that they can be loaded into and unloaded from the apparatus without changing their positions and postures. In other words, the cassettes 1a to 1c are fixed always in predetermined positions on a substantially horizontal plane, while the cassette tables 2a and 2b are disposed adjacent to and in parallel with each other on one of the sides of the L-shape. The cassette table 2c is disposed on the other side of the L-shape. The cassettes 1a and 1b are for storing unprocessed wafers and for recovering the processed wafers. They can store a plurality (usually 25) of wafers 20 as the substrates to be treated. The cassette 1c in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables 2a and 2b, and a conveyor 13 is disposed between the cassette tables 2a, 2b and the load lock chamber 5 and the unload lock chamber 6. The load lock chamber 5 is equipped with an evacuating device 3 and a gas introduction device 4, and can load unprocessed wafers in the vacuum apparatus through a gate valve 12a. The unload lock chamber 6 is similarly equipped with the evacuating device 3 and the gas introduction device 4, and can take out processed wafers to the atmosphere through a gate valve 12d. The conveyor 13 is equipped with a robot having X, Y, Z and θ axes, which operates so as to deliver and receive the wafers 20 between the cassettes 1a, 1b and the load lock and unload lock chambers 5 and 6 and the dummy wafers 30 between the cassette 1c and the load lock and unload lock chambers 5 and 6.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through gate valves 15a, 15b and 15c, respectively. A conveyor 14 capable of delivering the wafers 20 or the dummy wafers 30 from the load lock chamber 5 to the etching chambers 11a, 11b, 11c and of delivering them from the chambers 11a, 11b, 11c to the unload lock chamber 6 is disposed inside the transfer chamber 16. The transfer chamber 16 is equipped with an evacuating device 17 capable of independent evacuation.

The etching chambers 11a, 11b, 11c have the same structure and can make the same processing. The explanation will be given on the etching chamber 11b by way of example. The etching chamber 11b has a sample table 8b for placing the wafers 20 thereon, and a discharge chamber is so provided as to define a discharge portion 7b above the sample table 8b. The etching chamber 11b includes a gas introduction device 10b for introducing a processing gas in the discharge portion 7b and an evacuating device 9b for decreasing the internal pressure of the etching chamber 11b to a predetermined pressure. The etching chamber 11b further includes generation means for generating a microwave and a magnetic field for converting processing gas in the discharge portion 7b to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette 1c and the etching chambers 11a to 11c.

In a vacuum processing apparatus having the construction described above, the cassettes 1a, 1b storing unprocessed wafers are first placed onto the cassette tables 2a, 2b by a line transfer robot which operates on the basis of the data sent from a host control apparatus, or by an operator. On the other hand, the cassette 1c storing the dummy wafers is placed on the cassette table 2c. The vacuum processing apparatus executes the wafer processing or plasma cleaning on the basis of recognition by itself of the production data provided on the cassettes 1a to 1c, of the data sent from the host control apparatus, or of the command inputted by an operator.

For instance, the wafers 20 are sequentially loaded in the order from above into the etching chambers 11a, 11b, 11c by the conveyors 13 and 14, and are etched. The etched wafers are stored in their original positions inside the cassette 1a by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers 11a to 11c. Therefore, the original state must be recovered by removing the adhering matters by plasma cleaning. The controller 19 judges the timing of this plasma cleaning. In this case, a portion through which the plasma light passes is provided in each of the etching chambers 11a to 11c. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing of wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in an position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber 11a through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 1c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism for conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times of use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. A vacuum processing apparatus, comprising:
    a substrate storage device mount table for holding at least one substrate storage device;
    a first conveyor structure for transferring a substrate from a substrate storage device held on the substrate storage device mount table;
    a vacuum loader provided with a second conveyor structure and a plurality of vacuum processing chambers for loading substrates to be processed; and
    a lock chamber disposed between the first conveyor structure and the second conveyor structure,
    wherein:
        the first conveyor structure is disposed between the substrate storage device mount table and the lock chamber and in front of the lock chamber, the first conveyor structure and the second conveyor structure are respectively provided with a first robot and a second robot, and the first robot is shiftable in a direction perpendicular to an inlet of the lock chamber,
        the second robot is disposed in a conveyor chamber of the vacuum loader and faces to the lock chamber,
        the first robot faces to a set of substrates disposed in the substrate storage device and transfers the substrates one by one to the lock chamber, and one by one from the lock chamber to an original position in the substrate storage device from which a respective substrate had been transferred to the lock chamber, and the second robot is disposed in the conveyor chamber of the vacuum loader so as to face to the lock chamber, and
        the lock chamber is provided with both an inlet and an outlet formed in a horizontal line.

2. The vacuum processing apparatus according to claim 1, wherein each of the first and second robots has an arm which moves in horizontal and rotational directions.

3. The vacuum processing apparatus according to claim 1, wherein the first robot is movable in up and down directions.

4. The vacuum processing apparatus according to claim 1, wherein the first robot and the second robot transfer respectively sequentially the substrates.

5. The vacuum processing apparatus according to claim 4, further comprising a computer control system for controlling movement of the first and second robots.

6. The vacuum processing apparatus according to claim 4, wherein the first robot is exposed to the air, and the second robot is disposed in a vacuum condition.

7. The vacuum processing apparatus according to claim 1, wherein the first conveyor structure is provided with a track.

8. The vacuum processing apparatus according to claim 1, wherein the lock chamber is provided with a gate valve at the inlet, and the first robot travels along a front surface of the gate valve.

9. The vacuum processing apparatus according to claim 1, wherein at least two substrate storage devices are disposed on the substrate storage device mount table.

10. The vacuum processing apparatus according to claim 1, wherein the substrate storage device mount table faces the lock chambers.

11. A vacuum processing apparatus, comprising:
    a substrate storage device mount table for holding at least one substrate storage device:
    a first conveyor structure for transferring a substrate from a substrate storage device held on the substrate storage device mount table;
    a vacuum loader provided with a second conveyor structure; and
    two lock chambers, each having an inlet and an outlet, disposed between the first conveyor structure and the second conveyor structure, each of the two lock chambers having the inlet and outlet thereof in a horizontal line,
    wherein:
        the first conveyor structure and the second conveyor structure are respectively provided with a first robot and a second robot, and the vacuum loader is provided with a conveyor chamber connected to at least five chambers which comprise at least three vacuum processing chambers sequentially loading the substrates and the lock chambers, and
        the first robot faces to a set of substrates disposed in the substrate storage device and transfers the substrate one by one to a lock chamber of the at least two lock chambers, in which only one substrate can be disposed, and transfers the substrate one by one from a lock chamber of the at least two lock chambers to an original position in the substrate storage device from which a respective substrate had been transferred to said lock chamber, and the second robot is disposed in a conveyor chamber of the vacuum loader so as to make a rotational movement and a horizontal movement of X and Y axes.

12. The vacuum processing apparatus according to claim 11, wherein the first robot transfers substrates from the substrate storage device to any of the lock chambers, and the second robot transfers the substrates from any of the lock chambers through the conveyor chamber to any of the at least three vacuum processing chambers.

13. The vacuum processing apparatus according to claim 12, wherein the second robot transfers processed substrates from any of the at least three vacuum processing chambers through the conveyor chamber to any of the lock chambers, and the first robot transfers processed substrates from any of the lock chambers to the substrate storage device.

14. The vacuum processing apparatus according to claim 13, wherein the first robot travels on a track and is movable in a horizontal direction and a rotational direction.

15. The vacuum processing apparatus according to claim 11, wherein the first robot and the second robot maintain a substantially horizontal plane of surfaces of the substrates during transferring the substrates, so that the substantially horizontal plane of the surfaces of the substrates is kept in a horizontal state during the steps from a state storage device to a vacuum processing chamber.

16. The vacuum processing apparatus according to claim 11, wherein the first conveyor structure is provided with a track, and the first robot is a sole robot which travels on the track to transfer substrates between the substrate storage device and the first conveyor structure.

17. The vacuum processing apparatus according to claim 11, wherein the two lock chambers are a load lock chamber and an unload lock chamber, and the first robot transfers substrates between the substrate storage device and the load lock chamber, and processed substrate between the unload lock chamber and the substrate storage device.

18. The vacuum processing apparatus according to claim 19, which further comprises a control device which controls movement of the first and second robots, and the first robot returns processed substrates to the same substrate storage device from which substrates had been taken out for a process treatment.

19. The vacuum processing apparatus according to claim 11, wherein during at least a part of the period the first robot is transferring substrates from the substrate storage device to the first conveyor structure, the second robot is transferring substrates from the lock chamber to a vacuum loader.

20. The vacuum processing apparatus according to claim 11, wherein during at least a part of the period the first robot is transferring substrates from the substrate storage device to the first conveyor structure, the second robot is transferring the substrates from the conveyor chamber to a vacuum processing chamber.

21. The vacuum processing apparatus according to claim 11, wherein during at least a part of the period the first robot is transferring substrates from the substrate storage device to the first conveyor structure, the second robot is transferring processed substrates from a vacuum processing chamber to the conveyor chamber.

22. The vacuum processing apparatus according to claim 11, wherein during at least a part of the period the first robot is transferring the substrates from the substrate storage device to the first conveyor structure, the second robot is transferring processed substrates from the conveyor chamber to a lock chamber.

23. The vacuum processing apparatus according to claim 11, wherein during at least a part of the period the first robot is transferring the substrates from the first conveyor structure to a lock chamber, the second robot is transferring the substrates from the conveyor chamber to a vacuum processing chamber.

24. The vacuum processing apparatus according to claim 11, wherein during at least a part of the period to first robot is transferring the substrates from the first conveyor structure to a lock chamber, the second robot is transferring processed substrates from a vacuum processing chamber to the conveyor chamber.

25. The vacuum processing apparatus according to claim 11, wherein during at least part of the period the second robot is transferring processed substrates from to conveyor chamber to a lock chamber, the first robot is transferring processed substrates from the first conveyor structure to the substrate storage device.

26. The vacuum processing apparatus according to claim 11, wherein the second robot is a sole robot which accesses to the vacuum processing chambers.

27. The vacuum processing apparatus according to claim 11, wherein the two lock chambers include a load lock chamber and an unload lock chamber which are separate from each other, and the second robot is a sole robot which accesses both the load lock chamber and the unload lock chamber.

28. The vacuum processing apparatus according to claim 27, wherein the second robot is a sole robot accessing to the at least three vacuum processing chambers and the two lock chambers.

29. The vacuum processing apparatus according to claim 11, wherein the substrate storage device mount table faces the two lock chambers.

30. A vacuum processing apparatus, comprising:
a substrate storage device mount table for holding at least one substrate storage device;
a first conveyor structure for transferring a substrate held in a substrate storage device;
a vacuum loader provided with a second conveyor structure and a plurality of vacuum processing chambers sequentially loading substrates to be processed; and
two lock chambers, each having an inlet and an outlet, disposed between the first conveyor structure and the second conveyor structure, each of the two lock chambers having the inlet and outlet thereof in a horizontal line,
wherein:
the first conveyor structure includes a track along an inlet of the lock chambers,
the first conveyor structure is provided with a first robot which travels on the track,
the first robot transfers substrates from the substrate storage device to one of the lock chambers, and
the first robot faces to a set of substrates disposed in the substrate storage device and transfers the substrates one by one to one of the lock chambers, and one by one from one of the lock chambers to an original position in the substrate storage device from which a respective substrate had been transferred to said one of the lock chambers, and a second robot is disposed in a conveyor chamber of the vacuum loader so as to face the two lock chambers.

31. The vacuum processing apparatus according to claim 30, wherein the first robot is movable in horizontal and rotational directions.

32. The vacuum processing apparatus according to claim 31, wherein the first conveyor structure is exposed to the air.

33. The vacuum processing apparatus according to claim 30, wherein the track is a set of rails.

34. The vacuum processing apparatus according to claim 31, wherein the first conveyor structure is disposed in parallel to both the substrate storage device mount table and the lock chambers.

35. The vacuum processing apparatus according to claim 30, wherein the two lock chambers are a load lock chamber and a unload lock chamber which are respectively provided with gate valves, and the first conveyor structure communicates with the load lock chamber and the unload lock chamber through the respective gate valves.

36. The vacuum processing apparatus according to claim 35, wherein the substrate storage device mount table is exposed to an air, and the first robot transfers substrates from the substrate storage device to said load lock chamber.

37. The vacuum processing apparatus according to claim 31, wherein:
the substrate storage device mount table, the first conveyor structure and the two lock chambers are arranged in horizontal tandem,
at least two substrate storage devices are positioned on the substrate storage device mount table, and
the first robot accesses the at least two substrate storage devices.

38. The vacuum processing apparatus according to claim 30, wherein the substrate storage device mount table faces the two lock chambers.

39. A vacuum processing apparatus, comprising:
a substrate storage device mount table for holding at east one substrate storage device;
a first conveyor structure for transferring substrates from the substrate storage device held on the substrate storage device mount table and for transferring substrates to said substrate storage device, wherein the first conveyor structure transfers a respective substrate to the substrate storage device to an original location of the substrate storage device from which the respective substrate had been transferred by the first conveyor structure;
a vacuum loader provided with a second conveyor structure and at least three vacuum processing chambers; and
a plurality of lock chambers connected to the vacuum loader,
wherein:
a first robot, of the first conveyor structure, is shiftable in a direction perpendicular to an inlet of any of the plurality of lock chambers,
a second robot, of the second conveyor structure, has an arm accessing any of the plurality of lock chambers and the at least three vacuum processing chambers, to carry substrates to be processed and processed substrates, and
each of the plurality or lock chambers is provided with both an inlet and an outlet located in a horizontal line.

40. The vacuum processing apparatus according to claim 39, wherein the second robot is a sole robot disposed in a vacuum conveyor chamber of the vacuum loader.

41. The vacuum processing apparatus according to claim 40, wherein the first robot has an arm accessing any of the plurality of lock chambers and the substrate storage device.

42. The vacuum processing apparatus according to claim 39, wherein the substrate storage device mount table faces the plurality of lock chambers.

43. A vacuum processing, apparatus comprising;
a plurality of vacuum processing chambers for generating a plasma in each of said chambers;
a vacuum transferring chamber, being capable of evacuation, for transferring substrates and dummy substrates;
a plurality of cassette mount tables for mounting at least one cassette storing at least one substrate and at least one cassette storing at least one dummy substrate, in the atmosphere;
an atmospheric transfer device for transferring said substrates and said dummy substrates in the atmosphere, being capable of moving at least vertically and being controlled such that any of said substrates and any of said dummy substrates can be taken out of any location in said cassettes mounted on said plurality of cassette mount tables; and
a control means (a) for transferring the substrates and the dummy substrates from any location in any of said cassettes mounted on said plurality of cassette mount tables in the atmosphere to the vacuum processing chambers via said atmospheric transfer device and said vacuum transferring chamber, and (b) for transferring said substrates and said dummy substrates in said vacuum processing chambers to the original locations of the original cassettes, via said vacuum transferring chamber and said atmospheric transfer device.

44. A vacuum processing apparatus, comprising;
a plurality of vacuum processing chambers for generating a plasma in each of said chambers;
a vacuum transferring chamber for transferring substrates and dummy substrates;
a plurality of cassette mount tables for mounting at least one cassette storing at least one substrate and at least one cassette storing at least one dummy substrate, in the atmosphere;
an atmospheric transfer device for transferring said substrates and said dummy substrates in the atmosphere, being capable of moving at least vertically and being controlled such that any of said substrates and any of said dummy substrates can be taken out of any location in said cassettes mounted on said plurality of cassette mount tables; and
a control means (a) for transferring the substrates and the dummy substrates from any location in any of said cassettes mounted on said plurality of cassette mount tables in the atmosphere to the vacuum processing chambers via said atmospheric transfer device, a chamber for loading said substrates and said dummy substrates from the atmosphere into a vacuum atmosphere, and said vacuum transferring chamber, and (b) for transferring said substrate and said dummy substrates in said vacuum processing chambers to the original locations of the original cassettes, via said vacuum transferring chamber, a chamber for unloading said substrates and said dummy substrates from said vacuum atmosphere into the atmosphere, and said atmospheric transfer device.

45. A vacuum processing method in a processing apparatus comprising
(1) a plurality of vacuum processing chambers for generating a plasma in each of said chambers: (2) a vacuum transferring chamber, being capable of evacuation, for transferring substrates and dummy substrates; (3) a plurality of cassette mount tables for mounting at least one cassette storing at least one substrate and at least one cassette storing at least one dummy substrate, in the atmosphere; (4) an atmospheric transfer device for transferring said substrates and said dummy substrates in the atmosphere, being capable of moving at least vertically and being controlled such that any of said substrates and any of said dummy substrates can be taken out of any location in said cassettes mounted on said plurality of cassette mount tables; and (5) a control means,
wherein said method comprises steps of:
transferring said substrates and said dummy substrates from any location in any of said cassettes mounted on said plurality of cassette mount tables in the atmosphere to the vacuum processing chambers via said atmospheric transfer device and said vacuum transferring chamber; and
transferring said substrates and said dummy substrates in said vacuum processing chambers to the original locations of the original cassettes, via said vacuum transferring chamber and said atmospheric transfer device.

46. A vacuum processing method in a processing apparatus comprising (1) a plurality of vacuum processing chambers for generating a plasma in each of said chambers; (2) a vacuum transferring chamber for transferring substrates and dummy substrates; (3) a plurality of cassette mount tables for mounting at least one cassette storing at least one substrate and at least one cassette storing at least one dummy substrate, in the atmosphere; (4) an atmospheric transfer device for transferring said substrates and said dummy substrates in the atmosphere, being capable of moving at least vertically and being controlled such that any of said substrates and any of said dummy substrates can be taken out of any location in said cassettes mounted on said plurality of cassette mount tables; and (5) a control means, wherein said method comprises steps of:

transferring said substrates and said dummy substrates from any location in any of said cassettes mounted in said plurality of cassette mount tables in the atmosphere to the vacuum processing chambers via said atmospheric transfer device, a chamber for loading said substrates and said dummy substrates from the atmosphere into a vacuum atmosphere, and said vacuum transferring chamber; and transforming said substrates and said dummy substrates in said vacuum processing chambers to the original locations of the original cassettes, via said vacuum transferring chamber, a chamber for unloading said substrates and said dummy substrates from said vacuum atmosphere into the atmosphere, and said atmospheric transfer device.

* * * * *